United States Patent
Okubo et al.

(10) Patent No.: US 8,035,444 B2
(45) Date of Patent: Oct. 11, 2011

(54) AMPLIFIER APPARATUS

(75) Inventors: Yoichi Okubo, Tokorozawa (JP); Manabu Nakamura, Akishima (JP); Yasuhiro Takeda, Kodaira (JP); Taizo Ito, Kodaira (JP); Junya Dosaka, Hamura (JP); Terufumi Nagano, Hamura (JP); Hidekatsu Ueno, Kodaira (JP); Toshio Nojima, Sapporo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 12/615,687

(22) Filed: Nov. 10, 2009

(65) Prior Publication Data

US 2010/0117726 A1    May 13, 2010

(30) Foreign Application Priority Data

Nov. 12, 2008 (JP) .................................. 2008-289681

(51) Int. Cl.
*H03F 3/68* (2006.01)
(52) U.S. Cl. .................................... 330/124 R; 330/295
(58) Field of Classification Search .................... 330/84, 330/124 R, 286, 295
See application file for complete search history.

(56) References Cited

U.S. PATENT DOCUMENTS 6,737,922 B2 * 5/2004 Pengelly et al. .............. 330/295

FOREIGN PATENT DOCUMENTS

| JP | 2006-157900 | 6/2006 |
| JP | 2006-165856 | 6/2006 |
| JP | 2006-197556 | 7/2006 |
| JP | 2006-332829 | 12/2006 |
| JP | 2007-006164 | 11/2007 |

* cited by examiner

*Primary Examiner* — Khanh Nguyen
(74) *Attorney, Agent, or Firm* — Brundidge & Stanger, P.C.

(57) ABSTRACT

An amplifier capable of lowering an electrical current flowing in a peak amplifier before a carrier amplifier becomes saturated to thereby improve the efficiency of an entirety of the amplifier is provided. The amplifier includes a carrier amplifier circuit having an amplifying element operable in class-AB or class-B, and a plurality of peak amplifier circuits which have amplifying elements operating in class-B or class-C and which are arranged to start an operation in stages in response to an input level. An output of the carrier amplifier circuit and outputs of the peak amplifier circuits are combined together for signal output. One of the peak amplifier circuits which is rendered operative at the lowest input level is smaller in saturation output than the carrier amplifier circuit.

3 Claims, 6 Drawing Sheets

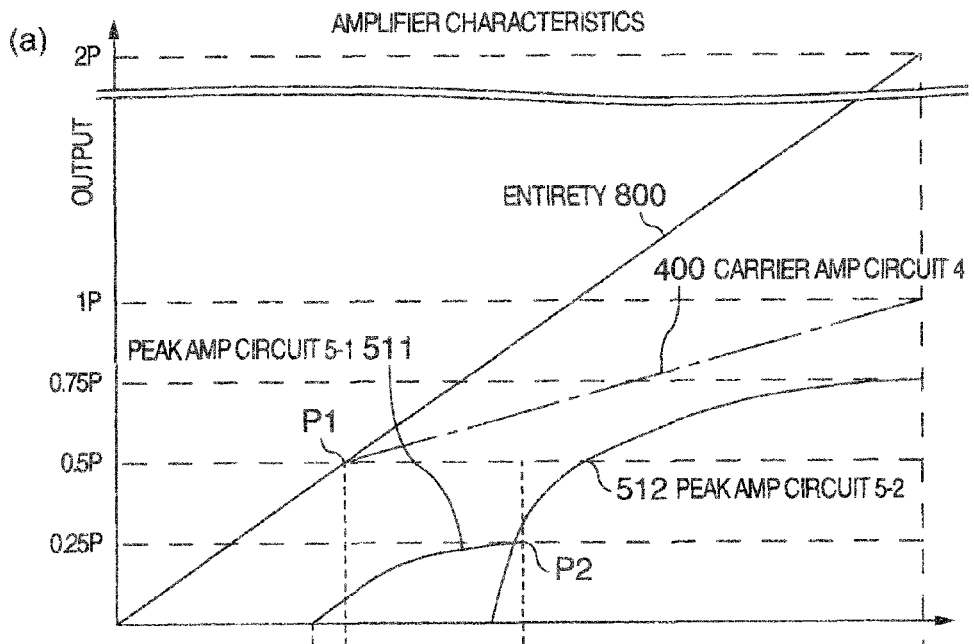
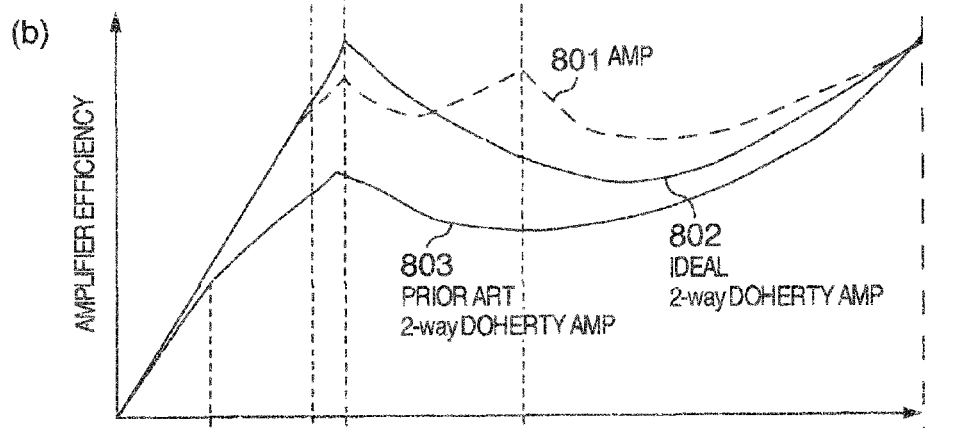
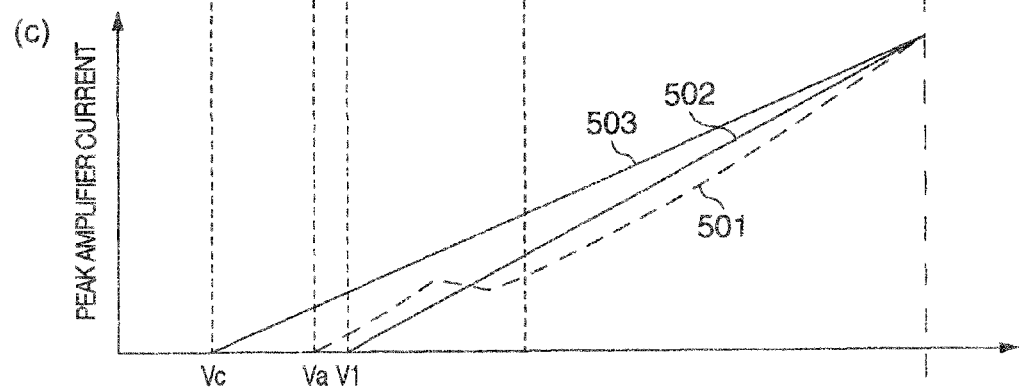
FIG.2

CONFIGURATION OF EACH AMP CIRCUIT OF ANOTHER AMP

CONFIGURATION OF HARMONIC WAVE GENERATION CIRCUIT

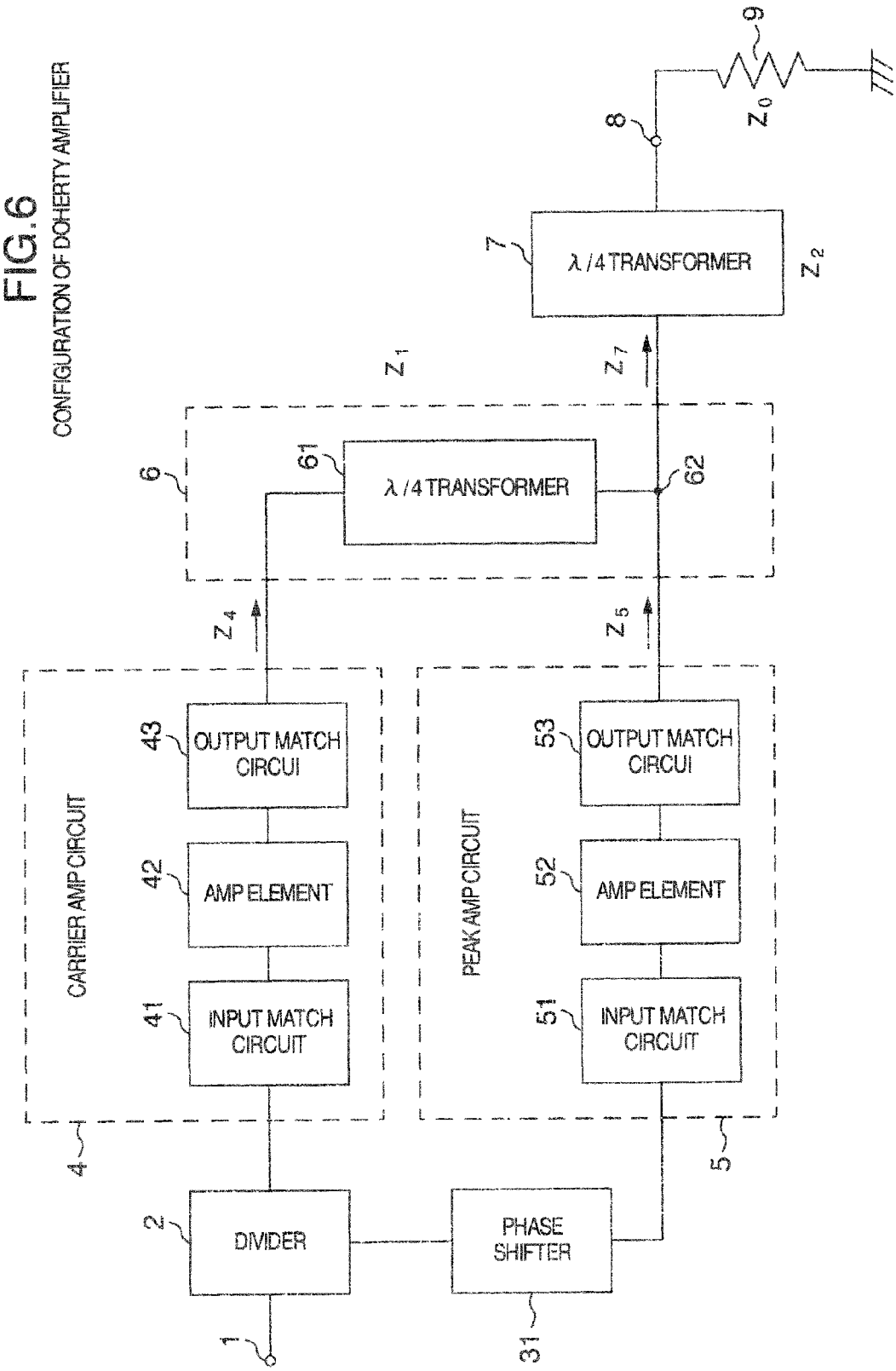

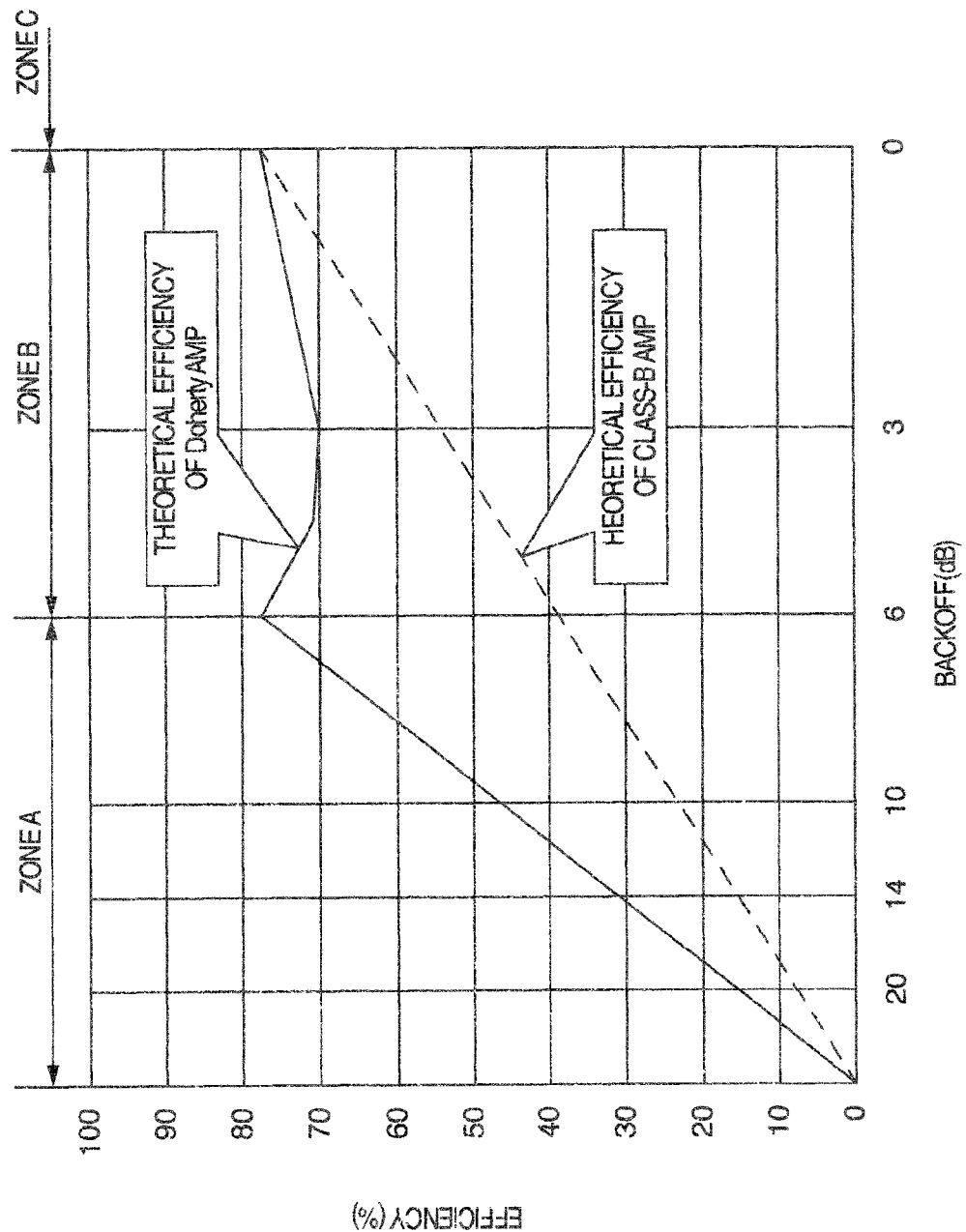

AMPLIFIER APPARATUS

INCORPORATION BY REFERENCE

The present application claims priority from Japanese applications JP2008-289681 filed on Nov. 12, 2008, the content of which is hereby incorporated by reference into this application.

BACKGROUND OF THE INVENTION

The present invention relates generally to amplifiers for use in base stations of a cellular telephone system or the like, and more particularly to an amplifier capable of improving the efficiency of Doherty amplifier circuitry.

Traditionally, in the case of electrical power amplification of a code division multiple access (CDMA) signal or a multi-carrier signal, a common amplifier is added a distortion compensation means for expanding the operation range of this common amplifier up to a nearby area of the saturation region to thereby lower electric power consumption. The distortion compensation means includes a feed-forward distortion compensation technique, pre-distortion compensation technique or else; however, with mere use of such distortion compensation, the achievability of lower power consumption reaches almost a limit. For this reason, in recent years, a specific type of amplifier circuitry, called the Doherty amplifier, draws attention as a high efficiency amplifier.

Prior Art Documents

It is noted that prior art documents concerning the Doherty amplifier include JPA-2006-332829 (Patent Document 1), JP-A-2006-197556 (Patent Document 2), JP-A-2007-006164 (Patent Document 3), JP-A-2006-165856 (Patent Document 4), and JP-A-2006-157900 (Patent Document 5).

Patent Documents 1-5 disclose that an input signal is divided for distribution into portions, one of which is amplified by a carrier amplifier that is operable in class-AB or class-B, and the other of which is amplified by a peak amplifier that operates in class-B or class-C, wherein these amplified ones are combined together for signal output.

In particular, Patent Documents 1-2 disclose therein Doherty amplifiers of the type having a parallel combination of more than two peak amplifiers, wherein these peak amplifiers are rendered operative in stages in response to an input level.

SUMMARY OF THE INVENTION

Doherty Amplifier

FIG. 6

An explanation will be given of a prior known Doherty amplifier with reference to FIG. 6. FIG. 6 is a block diagram showing a configuration of the conventional art Doherty amplifier.

As shown in FIG. 6, the conventional art Doherty amplifier is generally made up of an input terminal 1, power divider 2, phase shifter 3, carrier amplifier circuit 4, peak amplifier circuit 5, Doherty combination unit 6, quarter wavelength ($\lambda/4$) transformer 7, and output terminal 8.

The carrier amplifier circuit 4 is configured from an input matching circuit 41, amplifying element 42, and output matching circuit 43. The peak amplifier circuit 5 includes an input matching circuit 51, amplifying element 52 and output matching circuit 53. The Doherty combination unit 6 includes a $\lambda/4$ transformer 61 and node (combination point) 62.

Respective constituent components will be explained below.

The divider 2 is the one that divides a signal as input from the input terminal 1 into two portions for distribution.

The phase shifter 3 is for delaying the phase of one of those signals which are split by the divider 2.

The input matching circuit 41 of the carrier amplifier circuit 4 causes one signal divided and distributed by the divider 2 to be matched in impedance with the input side of the amplifier element 42.

The amplifying element 42 is an amplifier element which is biased to operate in class-AB and which is rendered operative from when an input power level stays low.

The output matching circuit 43 is for taking the matching of the output side of the amplifier element 42 with the $\lambda/4$ transformer 61.

The input matching circuit 51 of the peak amplifier circuit 5 is the one that receives from the phase shifter 3 a signal having its phase which is delayed by 90 degrees and matches this signal with the input side of the amplifier element 52.

The amplifying element 52 is an amplifier element which is biased in class-B or class-C, and starts its operation when the input level is high.

The output matching circuit 53 is for matching the output side of the amplifying element 52 with the node 62.

Additionally, the $\lambda/4$ transformer 61 of the Doherty combination unit 6 is the one that performs impedance conversion of an output signal of the carrier amplifier circuit 4 for achieving the matching with the node 62.

The node 62 is for combining together an output signal from the $\lambda/4$ transformer 61 and an output signal of the peak amplifier circuit 5.

The $\lambda/4$ transformer 7 is to perform impedance conversion of a combined signal at the node 62 for matching it with an output load 9.

An operation of the Doherty amplifier with the above-stated configuration will be explained below.

A signal that is input from the input terminal 1 is divided by the divider 2. One divided signal is input to the carrier amplifier 4 and then amplified by the amplifying element 42. An output signal of the carrier amplifier 4 is applied impedance conversion at the $\lambda/4$ transformer 61.

Another signal that is split by the divider 2 is delayed in phase by 90 degrees at the phase shifter 3 and then input to the peak amplifier 5, followed by amplification by the amplifying element 52.

An output of the $\lambda/4$ transformer 61 and an output of the peak amplifier 5 are combined at the node 62. The combined signal is impedance-converted by the $\lambda/4$ transformer 7 and is connected to the output load 9 through the output terminal 8. In this way, the operation of the conventional art Doherty amplifier is performed.

Here, an explanation will be given of the operation efficiency of the Doherty amplifier.

The carrier amplifier 4 and the peak amplifier 5 are different from each other in that the amplifying element 42 is biased in class-AB whereas the amplifying element 52 is biased either in class-B or in class-C. Due to this, the amplifier element 42 behaves to operate singularly until receipt of an input which permits the amplifier element 52 to start an operation. When the amplifier element 42 enters its saturation region (when the linearity of amplifier element 42 starts to corrupt), the amplifier element 52 starts to operate, causing an output of the amplifier element 52 to be supplied to the load 9 to thereby drive the load together with the amplifier element 42. At this time, a load line of the output matching circuit 43 changes from a high resistance to low resistance as will be described later; however, the efficiency is good because the amplifier element 42 is in the saturation region. When the input from the input terminal 1 further increases, the amplifier element 52 also becomes saturated. At this time also, the efficiency is good because the amplifier elements 42 and 52 are both saturated.

Efficiency of Doherty Amplifier

FIG. 7

Next, an explanation will be given of efficiency versus output power characteristics of the Doherty amplifier with reference to FIG. 7. FIG. 7 is an explanation diagram showing the efficiency versus output power characteristics of the Doherty amplifier and an ordinary class-B amplifier. In FIG. 7, a dotted line is used to designate the efficiency of standard class-B amplifier whereas a solid line indicates the theoretically defined collector efficiency or drain efficiency of Doherty amplifier in a simple model.

Note that the term "collector efficiency" as used herein refers to the ratio of radio frequency (RF) output power takable from the collector with respect to the product of a power supply voltage (current) being applied to the collector and a current (direct current) to be supplied from such power supply. The same goes with the drain efficiency.

The abscissa axis of the graph of FIG. 7 indicates the back-off (i.e., saturation output power with respect to the average output power of the amplifier). This is a numerical value indicative of a degree of margin or "luxury" that the input level has against the compression point, when an input level (compression point) relative to the input terminal 1 in which both of the amplifier elements 42 and 52 are saturated is set to zero decibels (0 dB).

As shown in FIG. 7, when the input level stays in a zone "A", only the carrier amplifier 4 is basically rendered operative. At a point whereat the back-off becomes 6 dB or therearound, the carrier amplifier 4 starts to be saturated, resulting in the efficiency reaching almost the maximum efficiency of class-B amplifier. Letting the maximum output of Doherty amplifier be Po, the output of the carrier amplifier 4 at this time is about Po/4.

In a zone B with the back-off being kept equal to or less than 6 dB, the output of carrier amplifier 4 increases from about Po/4 to Po/2 in accordance with an increase in input level. The output of the peak amplifier 5 increases from almost zero up to Po/2.

At this time, the sum of output power values of the carrier amplifier circuit 4 and peak amplifier circuit 5 is in proportion to the input power relative to the input terminal 1, with the same proportion constant as that in the zone A. When the peak amplifier 5 starts to operate, the efficiency once decreases; thereafter, it comes to have a peak again at the compression point at which the peak amplifier circuit 5 also becomes saturated. At the compression point, the carrier amplifier circuit 4 and the peak amplifier circuit 5 are equal to each other in output.

Regarding Impedance of Each Part

FIG. 6

An explanation will next be given of the impedance of each part of the Doherty amplifier with reference to FIG. 6.

As shown in FIG. 6, an output load $Z_0$ is defined to be constant in value; so, let it be the start point.

An impedance $Z_7$ when looking at the $\lambda/4$ transformer 7 from the node 62 is given by $Z_7 = Z_2^2/Z_0$, where $Z_2$ is the characteristic impedance of the $\lambda/4$ transformer 7.

An impedance $Z_4$ when looking at the $\lambda/4$ transformer 61 from the output matching circuit 43 is obtainable in a similar way to the above-noted case because the output impedance of the output matching circuit 53 becomes substantially infinite in the zone A. In a zone C, the load is equally shared so that each of the load impedance (an extent of contribution of the carrier amplifier circuit 4 at the node 62) $Z_4$ of the $\lambda/4$ transformer 61 and the load impedance $Z_5$ of the matching circuit 53 becomes equal to $2Z_7$. Thus, the following equations are obtained.

$$Z_4 = \begin{cases} \dfrac{Z_1^2}{Z_7} = \dfrac{Z_1^2}{\left(\dfrac{Z_2^2}{Z_0}\right)} = Z_0 \dfrac{Z_1^2}{Z_2^2} & \text{(zone A)} \\ \dfrac{Z_1^2}{2Z_7} = \dfrac{Z_0 Z_1^2}{2Z_2^2} & \text{(zone C)} \end{cases} \quad \text{(EQU 1)}$$

$$Z_5 = \begin{cases} \infty & \text{(zone A)} \\ 2Z_7 & \text{(zone C)} \end{cases} \quad \text{(EQU 2)}$$

Note here that $Z_1$ is the specific impedance of the $\lambda/4$ transformer 61.

Additionally, $Z_4$ and $Z_5$ are such that when falling within the zone B, each transits between a value taken in the zone A and a value in the zone C.

An explanation will now be given of the impedance in a case where the Doherty amplifier is applied to a high frequency region (e.g., a gigahertz or "GHz" region).

The impedance $Z_4$ becomes the half in value when the input signal level is relatively large (in zone C) with respect to an impedance value when the input signal is kept small (zone A). In other words, it exhibits occurrence of a twofold load variation. For example, letting $Z_7=25\Omega$ and $Z_1=50\Omega$, $Z_4$ is expected to change within a range between 100 to $50\Omega$. Accordingly, the load impedance of the amplifier element 42 also varies. Generally, this is called the load modulation.

Recent CDMA and OFDM signals are high in peak factor (the ratio of peak power to average power). To provide increased handleability against peak factors of 7 dB to 12 dB, specific types of amplifiers are used, including an "n-way" Doherty amplifier having a parallel connection of a plurality (n−1) of peak amplifier circuits, and an unequal power split Doherty amplifier with the output power of peak amplifier circuit being made greater than the output power of carrier amplifier circuit.

Regarding these amplifiers also, basic principles are the same as those stated supra.

Any one of the conventional art Doherty amplifiers is faced with a problem which follows. In actual applications, the peak amplifier is unable to start its operation immediately when the carrier amplifier is saturated. As the peak amplifier is rendered operative to a certain degree before the carrier amplifier is saturated, the resulting efficiency of an entirety of the amplifier at the saturation point or thereabout becomes the one that deteriorates the efficiency of the carrier amplifier.

The present invention has been made in view of the above-stated technical background, and an object of this invention is to provide an amplifier capable of improving the efficiency of an entirety of Doherty amplifier by lowering an electrical current flowing in the peak amplifier prior to saturation of the carrier amplifier.

To attain the foregoing object, in accordance with one aspect of this invention, there is provided an amplifier which includes a carrier amplifier circuit having an amplifying element that is operable in class-AB or class-B, and a plurality of peak amplifier circuits having amplifying elements operable in class-B or class-C, characterized in that an output of the carrier amplifier circuit and outputs of the plurality of peak amplifier circuits are combined together into a signal to be output, that the plurality of peak amplifier circuits start to operate in stages in response to an input level, and that the saturation output of one peak amplifier circuit of the plurality of peak amplifier circuits which starts to operate at the lowest input level is smaller than the saturation output of the carrier amplifier circuit.

In accordance with another aspect of the invention, the amplifier is arranged so that it further includes a harmonic wave generation circuit, which has a divider operative to divide for distribution an input signal of a basic frequency into basic wave signals, a harmonic generator which generates a secondary harmonic wave from one of the basic wave signals divided, an adjuster which operates to adjust the phase and amplitude of the secondary harmonic wave generated at the harmonic generator, and a combiner which combines the phase/amplitude-adjusted secondary harmonic wave and the other of the divided basic wave signals and then outputs a combined signal, wherein a secondary harmonic wave which is output from the harmonic wave generation circuit is injected into an input signal of the carrier amplifier circuit and/or peak amplifier circuit.

According to this invention, the amplifier is arranged to include the carrier amplifier circuit having the amplifying element operable in class-AB or class-B, and the plurality of peak amplifier circuits having the amplifying elements operable in class-B or class-C, wherein outputs of the carrier amplifier circuit and the plurality of peak amplifier circuits are combined together for signal output, wherein the plurality of peak amplifier circuits start to operate in stages in response to an input level, and wherein the saturation output of a peak amplifier circuit of the plurality of peak amplifier circuits which starts to operate at the lowest input level is less than the saturation output of the carrier amplifier circuit. Accordingly, this amplifier offers its advantageous effect which follows: the current flowing in the peak amplifier before the carrier amplifier becomes saturated is lowered to thereby make it possible to improve the efficiency of the amplifier as a whole.

Additionally, according to this invention, the above-stated amplifier is arranged to further comprise a harmonic wave generation circuit, which includes a divider operative to divide for distribution an input signal of a basic frequency into basic wave signals, a harmonic generator which generates a secondary harmonic wave from one of the basic wave signals divided, an adjuster which adjusts the phase and amplitude of the secondary harmonic wave generated at the harmonic generator, and a combiner which combines together the phase/amplitude-adjusted secondary harmonic wave and the other of the divided basic wave signals and then output a combined signal, wherein a secondary harmonic wave which is output from the harmonic wave generation circuit is injected into an input signal of the carrier amplifier circuit and/or peak amplifier circuit. Thus, the amplifier offers the following advantageous effect: even in the case of a modulation wave being input, efficiency degradation at those points except the point for adjustment of secondary harmonic waves is suppressed to thereby enable further enhancement of the efficiency-improving effect owing to harmonic wave reflection in the harmonic wave-injected carrier amplifier circuit and/or peak amplifier circuit. This makes it possible to improve the efficiency of the amplifier as a whole.

Other objects, features and advantages of the invention will become apparent from the following description of the embodiments of the invention taken in conjunction with the accompanying drawings.

BRIEF DESCRIPTION OF DRAWINGS

FIG. 2 shows graphs with plots of some major characteristics curves, wherein part (a) of FIG. 2 is an explanation diagram showing input-output power characteristics, part (b) is an explanation diagram showing input-amplifier efficiency, and part (c) is an explanation diagram showing an electrical current flowing in peak amplifier.

FIG. 6 is a configuration block diagram of one prior known Doherty amplifier.

FIG. 7 is a graph showing efficiency-output power characteristics of Doherty amplifier and ordinary class-B amplifier.

DESCRIPTION OF THE EMBODIMENTS

Figure 1:
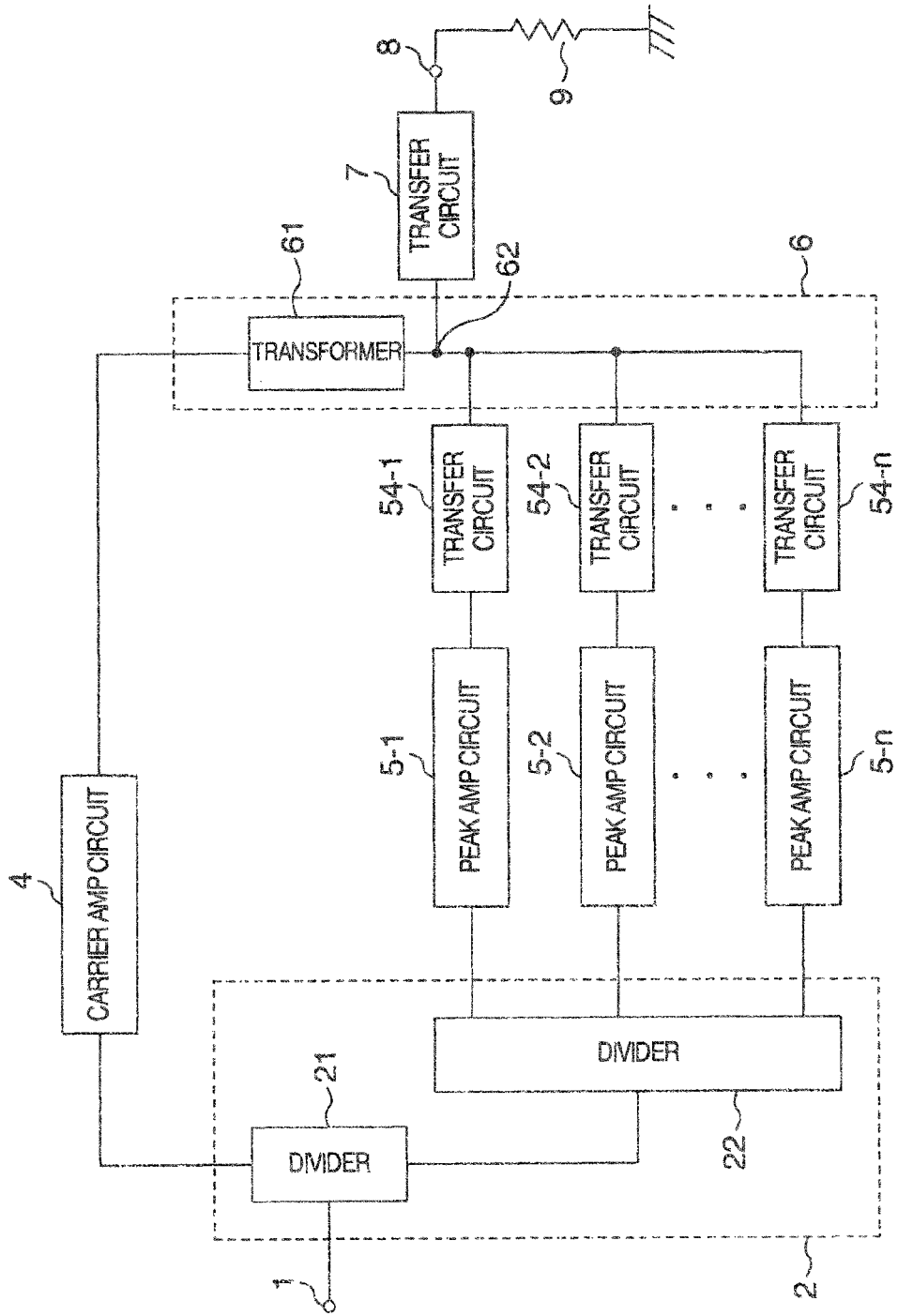
FIG. 1 is a block diagram showing a configuration of an amplifier in accordance with one embodiment of this invention.

Currently preferred embodiments of this invention will be described in detail with reference to the accompanying figures of the drawing below.

An amplifier in accordance with one embodiment of this invention is an n-way Doherty amplifier which is arranged to divide an input signal into portions for distribution and amplify these divided signals by a carrier amplifier (carrier amplifier circuit) which operates either in class-AB or in class-B and a plurality of peaking amplifiers (peak amplifier circuits) which operate in class-B or class-C and then combine the amplified signals to thereby output a resultant combined signal, wherein each peak amplifier operates in stages in responding to an input level, and wherein the maximum output of a peak amplifier which starts its operation at the minimum input level is set smaller than the maximum output of the carrier amplifier, whereby an electrical current flowing in the peak amplifier at an input level before the carrier amplifier becomes saturated is lowered to thereby make it possible to improve the efficiency of an entirety of the amplifier.

An amplifier in accordance with another embodiment of this invention is the one that includes at an input stage of the amplifier with the above-stated configuration a harmonic wave generation circuit which generates a harmonic wave signal having its frequency that is two times higher than the frequency of a basic wave, and further includes a harmonic wave reflection circuit in a respective one of the carrier amplifier and the plurality of peak amplifiers, wherein in the case of a harmonic wave being input thereto, efficiency deterioration at those point other than a harmonic wave adjustment point is lowered to achieve efficiency improvement owing to the harmonic wave reflection in the carrier amplifier and the peak amplifiers, thereby enabling further improvement of the efficiency of the amplifier as a whole.

Configuration of Embodiment

FIG. 1

An amplifier in accordance with one embodiment of this invention will be described with reference to FIG. 1. FIG. 1 is a block diagram showing a circuit configuration of the amplifier (amplifier) in accordance with the illustrative embodiment of this invention. It should be noted that constituent parts or components which are similar to those shown in FIG. 6 are designated by the same reference numerals, with their detailed explanations being omitted herein for purposes of brevity of the description.

As shown in FIG. 1, this amplifier includes, as the same parts as those of the conventional art, an input terminal 1, a power divider 21, a carrier amplifier 4, a quarter wavelength ($\lambda/4$) transformer 61, a $\lambda/4$ transformer 7, an output terminal 8 and an output load 9, and further includes a divider 22, peak amplifier circuits 5-1, 5-2, ..., 5-$n$ (where "n" is a positive integer), and signal transfer lines 54-1, 54-2, ..., 54-$n$.

A Doherty combination unit 6 is arranged to have a given electrical length ranging from zero to $\lambda/2$.

The transfer lines 54-1 to 54-$n$ have an electrical length which permits an impedance of each peak amplifier circuit 5-1, ..., 5-$n$ as viewed from a node 62 to become larger in value while the peak amplifier circuits 5-1 to 5-$n$ are rendered inoperative.

The divider 22 is responsive to receipt of a signal that is split by the divider 21 to the peak amplifier circuit side, for distributing it among the plurality of peak amplifier circuits 5-1 to 5-$n$. Although a configuration using the dividers 21 and 22 is shown in FIG. 1 for the purpose of facilitating the understanding of the block, the configuration for signal distribution to each amplifier circuit may be replaced with another configuration when the need arises. Note that in FIG. 1, the arrangement with the combination of the dividers 21 and 22 is shown as a distribution unit 2.

This amplifier is also provided with a phase shifter which performs phase adjustment of a signal passing through the carrier amplifier circuit 4 and signals passing through the peak amplifier circuits 5-1 to 5-$n$, although its illustration is omitted in the circuit diagram of FIG. 1 in order to simplify the explanation.

A configuration of the carrier amplifier circuit 4 is similar to that of the conventional art in that this circuit has an input matching circuit, amplifying element and output matching circuit. The amplifier element of the carrier amplifier circuit 4 operates in class-AB or in class-B.

A configuration of each peak amplifier circuit 5-1, ..., 5-$n$ is similar to that of the conventional art Doherty amplifier shown in FIG. 6 in that it has an input matching circuit, amplifying element and output matching circuit.

The amplifier elements of the peak amplifier circuits 5-1 to 5-$n$ are operable in class-B or class-C, and are biased in a stepwise fashion in such a way as to start operations in stages in a way depending on a change in input level. In the example of FIG. 1, the peak amplifier circuits 5-1 to 5-$n$ are arranged to start operations sequentially at higher input levels in a way which follows: firstly, the peak amplifier circuit 5-1 is rendered operative at the lowest input level; then, the peak amplifier 5-2 is rendered operative at the second lowest level, and the following ones are activated in this order of sequence.

One feature of this amplifier lies in that the peak amplifier circuits 5-1 to 5-$n$ are arranged so that each of them is less in saturation output than the carrier amplifier circuit 4 as will be described in detail later. Here, for the purpose of facilitating the understanding, respective peak amplifier circuits 5-1 to 5-$n$ are designed to become greater in maximum output power P with an increase in bias level; to do this, the value setting used is as follows: $P_{5-1} < P_{5-2} < ... < P_{5-n}$.

The use of a saturation power-lessened amplifying element for the peak amplifier circuit 5 eliminates the need for large power in its start-up event. This makes it possible to reduce an electric current to be flown before the carrier amplifier circuit 4 becomes saturated as will be described later. Thus it is possible to prevent degradation of the efficiency. In addition, when compared to an element which is large in saturation power, the saturation power-lowered element is higher in efficiency as far as their outputs are the same; thus, it is possible to achieve the intended efficiency improvement as a whole.

Especially, in this amplifier, the saturation output of the peak amplifier circuit 5 which is rendered operative at the lowest input level (i.e., peak amplifier circuit 5-1 in the example of FIG. 1) is arranged to be smaller than the saturation output of the carrier amplifier circuit 4, thereby improving the efficiency significantly.

Amplifier's Operation

FIG. 1

An operation of the amplifier will be explained with reference to FIG. 1.

In this amplifier, a signal that is input from the input terminal 1 is divided for distribution into two signal components, one of which is input to the carrier amplifier circuit 4, and the other of which is input to the divider 22.

The signal as input to the carrier amplifier circuit 4 is amplified by the amplifier element, impedance-converted by the $\lambda/4$ converter 61, and then input to the node 62.

The signal that is input to the divider 22 is distributed to the plurality of peak amplifier circuits 5-1 to 5-$n$ and amplified by each peak amplifier circuit 5 and then input to the node 62 by way of the transfer line(s) 54 for combination at the node 62 with a signal which is supplied from the carrier amplifier circuit 4.

Then, the resulting combined amplification signal is impedance-converted by the $\lambda/4$ converter 7, output to the output terminal 8, and then supplied to the load 9.

In this way, the operation of the amplifier is performed.

Characteristics of Amplifier

An explanation will next be given of some electrical characteristics of this amplifier using FIG. 2. In FIG. 2, the characteristics of an amplifier having two stages of peak amplifier circuits as the peak amplifier circuit group will be explained. More specifically, the amplifier to be discussed herein is a circuit configuration with a parallel combination of the peak amplifier circuit 5-1 and peak amplifier circuit 5-2, which is connected to the output stage of the divider 22 in FIG. 1.

Part (a) of FIG. 2 is a graph showing input-output power characteristics curves, part (b) of FIG. 2 is a graph showing amplifier efficiency versus input power level characteristics curves, and part (c) is a graph showing plots of a current flowing in peak amplifier.

Input-Output Characteristics

Part (a) of FIG. 2

In part (a) of FIG. 2, the transverse axis indicates input power whereas vertical axis denotes output power. The saturation output of the carrier amplifier circuit 4 is represented as P, the saturation output of the peak amplifier circuit 5-1 is indicated by 0.25 P, and the saturation output of the peak amplifier circuit 5-2 is denoted by 0.75 P.

As shown in part (a) of FIG. 2, the carrier amplifier circuit 4 operates from a region which is low in input power, and an output 400 of the carrier amplifier circuit 4 increases with an increase in input power. Then, at a point P1 whereat the output power approximately becomes the half (½) of the saturation power or in the vicinity thereof, the carrier amplifier circuit 4 starts to be saturated.

On the other hand, when the peak amplifier circuit 5-1 starts its operation at an input level lower than the point P1, an output 511 of the peak amplifier circuit 5-1 appears. In a range up to the point P1, since an output 511 of the peak amplifier circuit 5-1 is small, it does not happen that significant influence is exerted on an output 800 of the entire circuitry.

When the input increases resulting in an increase in output 511 of the peak amplifier circuit 5-1, the output 400 of the carrier amplifier circuit 4 slightly increases due to application of load modulation thereto. The entire output 800 is equal to the sum of the output 400 of carrier amplifier circuit 4 and the output 511 of peak amplifier circuit 5-1.

Thereafter, when the output 511 of the peak amplifier circuit 5-1 gets closer to the saturation (at point P2), the peak amplifier circuit 5-2 starts an operation, resulting in its output 512 appearing The carrier amplifier circuit 4 is further applied the load modulation so that its output increases.

The entire output 800 at this time is equal to the sum of the output 400 of carrier amplifier circuit 4 and the output 511 of peak amplifier circuit 5-1 plus the output 512 of peak amplifier circuit 5-2.

Although the circuitry having two stages of peak amplifier circuits 5-1 and 5-2 has been explained in FIG. 2, the same is true for an amplifier with n stages of the peak amplifier circuits 5-1 to 5-n: first, the peak amplifier circuit 5-1 starts an operation whereby load modulation is applied to the carrier amplifier circuit 4, resulting in an increase in output of the carrier amplifier circuit 4; when the peak amplifier circuit 5-1 starts to be saturated, the peak amplifier circuit 5-2 is rendered operative to thereby perform a similar operation, followed by execution of similar operations until the peak amplifier circuit 5-n becomes saturated.

Efficiency

Part (b) of FIG. 2

The efficiency will be discussed with reference to part (b) of FIG. 2.

Here, the efficiency of the "first" amplifier having the parallel combination of peak amplifier circuits 5-1 and 5-2 is indicated by reference numeral 801. The efficiency of an ideal output-equalized two-way Doherty amplifier is designated by numeral 802. The efficiency of conventional art two-way Doherty amplifier is denoted by 803.

The efficiency 802 of the ideal output-equalized two-way Doherty amplifier becomes high at the point P1 at which the carrier amplifier circuit 4 starts to be saturated. Whereas a notable drop-down is temporarily observed within a region beyond the point P1, the efficiency 801 of the first amplifier becomes high when the peak amplifier circuit 5-1 becomes saturated (at point P2). Thus, it can be seen that the efficiency is drastically improved in this region.

The efficiency 801 of the first amplifier exhibits a certain degree of efficiency degradation due to the influence of activation of the peak amplifier circuit 5-2 after the efficiency reaches a peak at the point P2. However, the efficiency behaves to recover at points falling within a range of from the point P1 to point P2 and there are three efficiency peak points, thereby the entire efficiency is also improved when compared to the efficiency 802 of the ideal equal-output two-way Doherty amplifier.

Although the explanation here is under the assumption that two stages of peak amplifier circuits are used, the same is true on the case of n stages of peak amplifier circuits being provided therein. By designing the peak amplifier circuits 5-1 to 5-n so that these become saturated sequentially, it is possible to increase the number of the efficiency maximized points. This in turn permits the entire efficiency to improve accordingly.

Current of Peak Amplifier Circuit

Part (c) of FIG. 2

An explanation will be given of an electrical current flowing in the peak amplifier circuit 5 with reference to part (c) of FIG. 2.

Here, a current flowing in the peak amplifier circuit of the first amplifier having peak amplifier circuits 5-1 and 5-2 is indicated by numeral 501. A current flowing in the peak amplifier circuit of the ideal equal-output two-way Doherty amplifier is indicated by 502. A current of the conventional art two-way Doherty amplifier is indicated by 503.

In the conventional art two-way Doherty amplifier, the saturation power of peak amplifier circuit is relatively large; thus, in order to output electrical power required in startup events, it is necessary to start an operation before the carrier amplifier circuit 4 becomes saturated. For this reason, the current 503 of the peak amplifier circuit of the conventional art two-way. Doherty amplifier starts to flow when the voltage is an input point Vc, which is lower than an input V1 at which the current 502 of the ideal equal-output two-way Doherty amplifier becomes zero, resulting in a total current becoming the current indicated by numeral 503. This is larger than the current 502 of the ideal equal-output two-way Doherty amplifier.

On the contrary, the peak amplifier circuit of the first amplifier uses the peak amplifier circuit 5-1 of the type having a small saturation output; thus, the current to be flown before the carrier amplifier circuit 4 is saturated is made smaller without difficulties. Furthermore, when compared to an element which is large in saturation power, an element which is less in saturation power is higher in efficiency at the same output. With this feature, it is possible to accomplish the intended efficiency improvement of the amplifier.

In the peak amplifier circuit of the first amplifier, a current starts to flow when the voltage is a point Va which is slightly lower from the point V1, resulting in the whole current becoming appreciably lower when compared to the conventional art. Thus, the efficiency improves as has been shown in part (b) of FIG. 2.

Advantageous Effects of Embodiment

According to the amplifier in accordance with one embodiment of this invention, this is an n-way Doherty amplifier having peak amplifier circuits 5-1 to 5-n which are arranged to operate in stages in response to an input level, wherein the amplifier is arranged so that the saturation output of the peak amplifier circuit 5-1, . . . , 5-n is less than the saturation output of the carrier amplifier circuit 4. Thus it is possible to lower the current flowing in the peak amplifier circuit 5 before the carrier amplifier circuit 4 is saturated. This makes it possible to improve the efficiency as a whole.

Especially in this amplifier, the saturation output of the peak amplifier circuit 5 (here, peak amplifier circuit 5-1) which starts its operation at the minimum input level is made smaller than that of the carrier amplifier circuit 4; thus, it is possible to drastically lower the current that unintentionally starts to flow in the peak amplifier circuit 5 before the carrier amplifier circuit 4 starts to be saturated, thereby enabling the amplifier to improve the efficiency as a whole.

Although this amplifier has been described under the assumption that the saturation output of the carrier amplifier circuit 4 is equal to a total sum of saturation outputs of the peak amplifier circuits 5-1 to 5-n, the amplifier may be modified so that the total saturation output of all the peak amplifier circuits 5-1 to 5-n is higher than the saturation output of the carrier amplifier circuit 4 or, alternatively, the saturation output of part of the peak amplifier circuitry is higher—even in this case, such modified amplifier is explainable based on the same theory stated supra. In short, this amplifier is effective for use with those signals which are high in peak factor.

While it is generally desirable that the peak amplifier circuits 5-1 to 5-n become sequentially larger in saturation output in responding to the bias level, it is also possible to modify it based on judgment in design phase. In addition, regarding exactly how the saturation output of the peak amplifier circuit 5-1 that is the lowest in bias level is lessened in comparison with the carrier amplifier circuit 4, this may also be determinable based on design judgment.

Another Amplifier

FIG. 3

Currently known configurations for improving the efficiency of Doherty amplifier include electrical circuitry of the type having a harmonic wave reflection circuit for reflecting a harmonic wave on a carrier amplifier circuit and peak amplifier circuit(s).

Consequently, an amplifier in accordance with another embodiment of this invention is provided as an amplifier which employs the harmonic wave reflection technology to thereby further enhance the advantageous effect as to the amplifier efficiency improvement.

Figure 3:
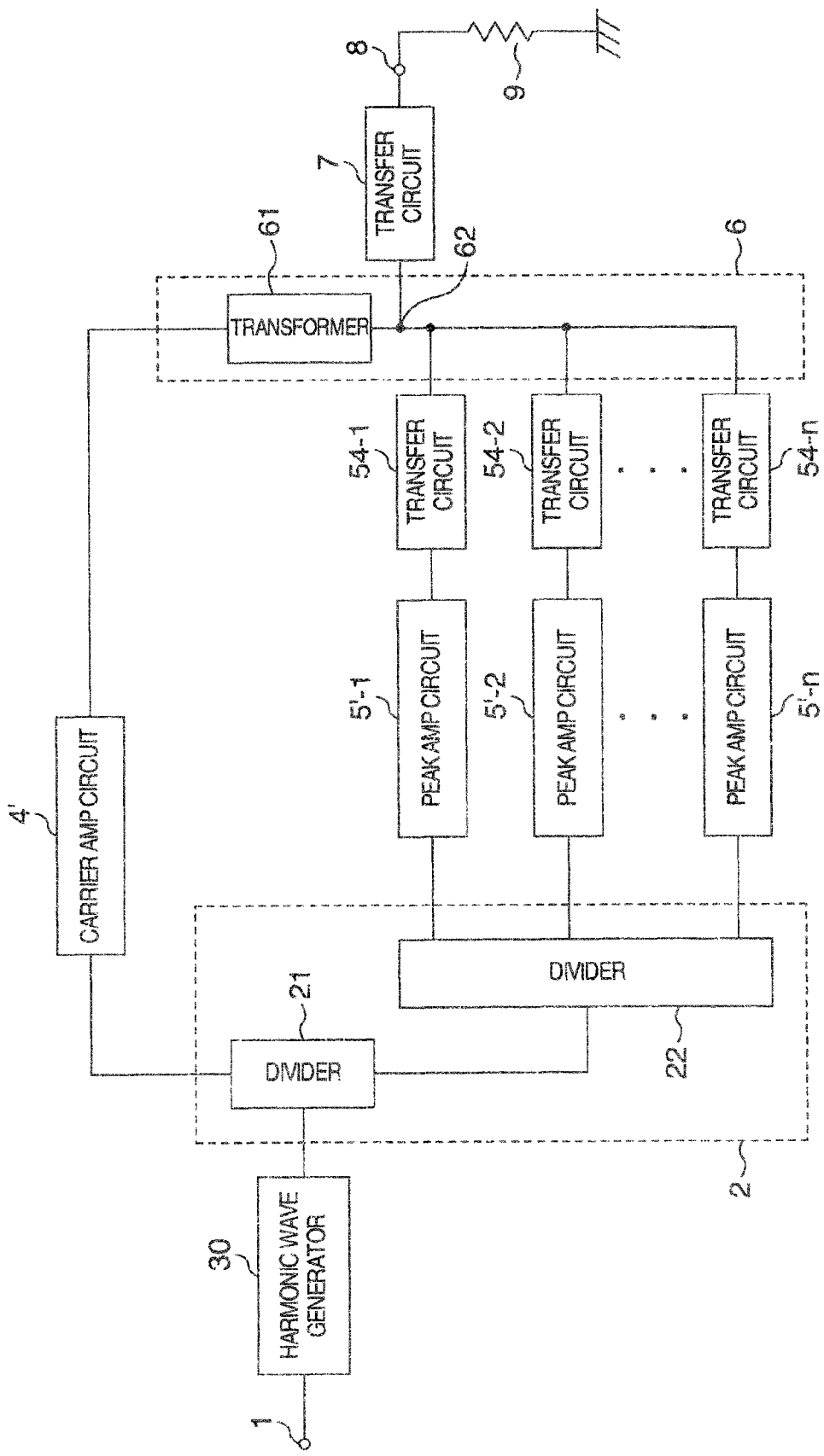
FIG. 3 is a block diagram showing a configuration of an amplifier in accordance with another embodiment of this invention.

A configuration of the amplifier in accordance with another embodiment of this invention will be described with reference to FIG. 3. FIG. 3 is a block diagram showing the configuration of the amplifier (another amplifier) in accordance with another embodiment of the invention. Note that parts or components similar in structure and operation to those shown in FIG. 1 are designated by the same reference numerals, with their explanations being eliminated herein.

As shown in FIG. 3, the another amplifier is similar in basic configuration to the above-stated amplifier of FIG. 1, with a harmonic wave generating circuit 30 that generates a harmonic wave being provided at the input stage of the divider 21. In addition, the amplifier of FIG. 3 is arranged to have a carrier amplifier circuit 4' and peak amplifier circuits 5'-1 to 5'-n, each of which includes a harmonic wave reflector circuit that functions to reflect a harmonic wave.

The harmonic wave generator circuit 30 is the one that generates a secondary harmonic wave of a basic wave, which circuit injects the secondary harmonic wave into an input signal to thereby enhance the harmonic wave reflection effect at the carrier amplifier circuit 4' and peak amplifier circuits 5'-1 to 5'-n, thus enabling further improvement of the amplifier efficiency.

A configuration of the harmonic wave generator circuit 30 will be described in detail later.

The peak amplifier circuits 5'-1 to 5'-n are similar to the peak amplifier circuits 5-1 to 5-n shown in FIG. 1 except that the former has the harmonic wave reflector circuit. The peak amplifier circuits 5'-1 to 5'-n are changed to be different in bias level from one another to ensure that these operate in stages in a way depending on a variable input level. The saturation output of a peak amplifier circuit 5' which starts to operate at the lowest input level is less than the saturation output of the carrier amplifier circuit 4'.

Amplifier Circuit Configuration in Another Amplifier

FIG. 4

Figure 4:
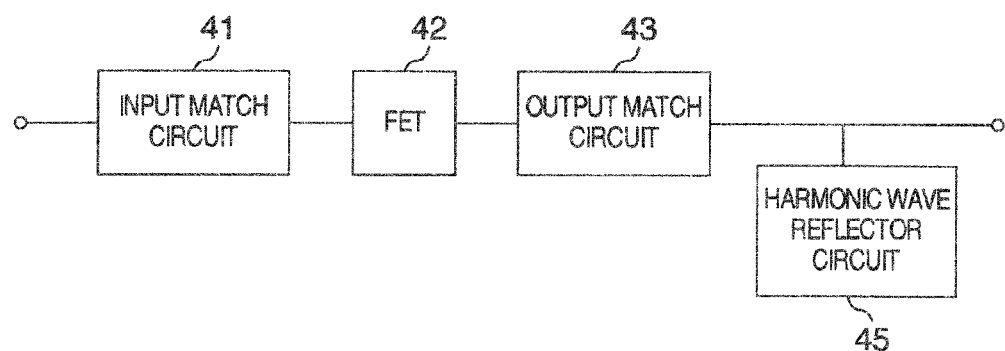
FIG. 4 is a configuration block diagram of the amplifier having a carrier amplifier circuit and peak amplifier circuits.

FIG. 4 is a block diagram showing a configuration of a respective one of the carrier amplifier circuit 4' and peak amplifier circuits 5'-1 to 5'-n in the amplifier of FIG. 3 also embodying the invention. Note here that in FIG. 4, reference numerals are added while taking the carrier amplifier circuit 4' as an example; however, a similar configuration is employable for each of the peak amplifier circuits 5'-1 to 5'-n.

As shown in FIG. 4, the carrier amplifier circuit 4' has an input match circuit 41, an amplifying element 42 such as a field effect transistor (FET), an output match circuit 43, and a harmonic wave reflector circuit 45.

The harmonic wave reflector circuit 45 is a high-frequency termination circuit which has high input impedance with respect to the frequency of the basic wave and which exhibits low input impedance against a secondary harmonic wave frequency thereof. In other words, the harmonic wave reflector circuit 45 has its characteristics with increased reflectivity of secondary harmonic waves.

Harmonic Wave Generator Circuit 30

FIG. 5

Figure 5:
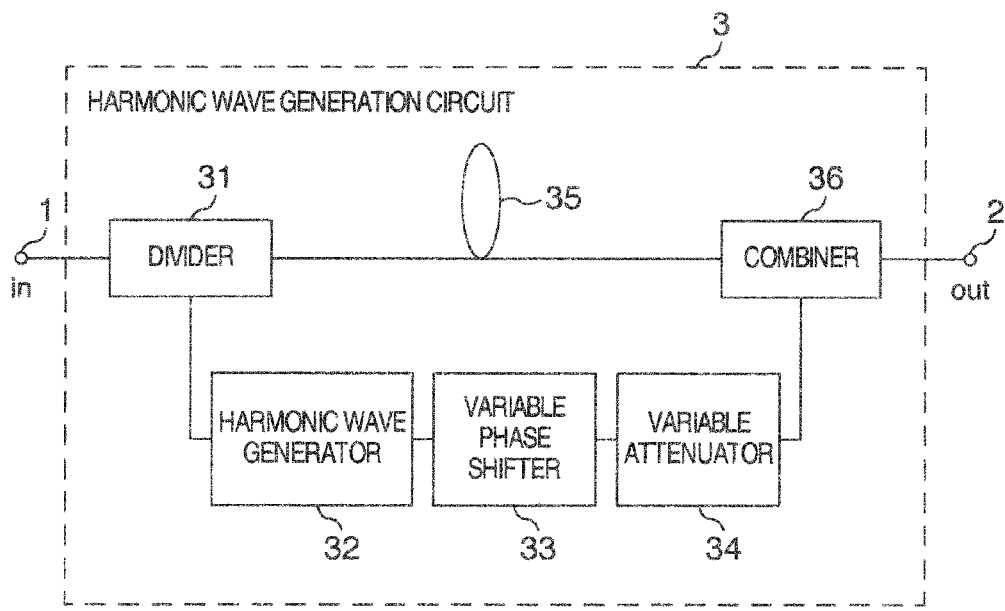
FIG. 5 is a configuration block diagram of a high-harmonic wave generation circuit.

A configuration of the harmonic wave generator circuit 30 will be explained using FIG. 5. FIG. 5 is a configuration block diagram of the harmonic wave generator circuit 30.

As shown in FIG. 5, the harmonic wave generator circuit 30 is the circuit that generates a harmonic wave to be injected into an input signal of the divider 21 in the amplifier of another embodiment shown in FIG. 3. This circuit is configured from a divider 31, delay line 35, secondary harmonic wave generator 32, variable phase shifter 33, variable attenuator 34 and combiner 36.

The divider 31 splits an input signal from the input terminal 1.

The secondary harmonic wave generator 32 is the one that generates a harmonic wave. In the first amplifier, this generator is arranged to generate a secondary harmonic wave.

The variable phase shifter 33 is for adjustment of the phase of such secondary harmonic wave which is generated at the secondary harmonic wave generator 32.

The variable attenuator 34 is for adjusting the amplitude of the secondary harmonic wave that is generated by the secondary harmonic wave generator 32.

It may be configured that a part made up of the variable phase shifter 33 and the variable attenuator 34 is functionally equivalent to a vector adjuster which performs vector adjustment of the secondary harmonic wave generated. In the circuitry of FIG. 5, the layout order of the secondary harmonic wave generator 32, variable phase shifter 33 and variable attenuator 34 in a series array thereof may be changed on a case-by-case basis.

The variable phase shifter 33 and variable attenuator 34 are for adjusting the phase and amplitude of the secondary harmonic wave that is generated by the secondary harmonic wave generator 32 in such a way to optimize the relationship with the phase and amplitude of a secondary harmonic wave to be generated at an amplifier portion in a post stage of the divider 21, and simultaneously for adjusting the phase and amplitude in such a way as to optimize an offset in phase between the basic wave and the secondary harmonic wave and also a ratio of amplitude level. Typically, variable phase shifter 32 and variable attenuator 34 are adjusted to ensure that the most excellent efficiency is obtained at a specific input level of the input signal (i.e., adjustment point, such as the point P1 shown in FIG. 2 as an example).

The delay line 35 delays an input signal (basic wave) from the divider 31, by a degree corresponding to a total processing time of the secondary harmonic wave generator 32, variable phase shifter 33 and variable attenuator 34.

The combiner 36 combines the delayed basic wave signal and the phase/amplitude-adjusted secondary harmonic wave as output from the variable attenuator 34 to produce a combined signal, which is output to the divider 21.

In this way, the harmonic wave-injectable amplifier of another embodiment shown in FIG. 3 offers increased efficiency at the specific input level point P1. However, the efficiency can decrease at other points except this point P1: in the case of a harmonic wave being input, the intended harmonic wave injectability is not fully obtained.

To avoid this, the amplifier of another embodiment is arranged as the n-way Doherty amplifier that uses a low-saturation amplifying element for the peak amplifier circuit 5'-1 whereby efficiency improvement is achieved to thereby enhance the efficiency-improving effect owing to the harmonic wave injection.

One notable advantage of the amplifier of FIGS. 2 and 3 lies in its ability to improve the efficiency not only at the point P1 whereat the carrier amplifier circuit 4' starts to be saturated but also within a range between the points P1 and P2. This contributes to suppression of efficiency deterioration otherwise occurring when a modulation wave is input in the harmonic wave injection-performed Doherty amplifier, thereby making it possible to retain high efficiency.

Additionally, the occurrence frequency of signal level becomes smaller as it is becoming a small signal from the average power. Thus, it is desirable to improve the efficiency at those points near the point P1, rather than improving the efficiency at a higher input level. In the example shown in FIG. 2, this is the case where the average power is set to 0.5 P, and the efficiency at a nearby region thereof is enhanced.

Advantageous Effects of Another Amplifier

The amplifier in accordance with another embodiment of this invention is an n-way Doherty amplifier having peak amplifier circuits 5'-1 to 5'-n operating in stages in response to an input level, which amplifier is arranged so that the saturation output of the peak amplifier circuit 5'-1, ..., 5'-n is smaller than the saturation output of the carrier amplifier circuit 4', and which includes the harmonic wave reflector circuit in each of the carrier amplifier circuit 4' and peak amplifier circuits 5'-1 to 5'-n and further includes the harmonic wave generator circuit 30 at the input stage. Accordingly, even when a harmonic wave is input, efficiency deterioration at those points other than the harmonic wave adjustment point is suppressed to further enhance the efficiency improvement owing to the harmonic wave injection and the harmonic wave reflection, thereby improving the efficiency of the amplifier device as a whole.

Although in FIG. 3 the harmonic wave generator circuit 30 is provided at the input stage of the divider 21, this circuit may alternatively be provided at an input stage of the carrier amplifier circuit 4', causing the harmonic wave injection to be performed for the carrier amplifier circuit 4' only. Alternatively, the harmonic wave generator circuit 30 may be provided at an input stage of the divider 22 to thereby cause the harmonic wave to be injected into only the peak amplifier circuits 5-1 to 5-n to thereby attain the efficiency improvement as a whole. It is desirable for the harmonic wave-injected amplifier circuit to have harmonic wave reflector circuitry, such as the circuit 45 in FIG. 4.

INDUSTRIAL APPLICABILITY

This invention is adaptable for use in amplifiers capable of improving the amplification efficiency of Doherty amplifier circuitry.

It should be further understood by those skilled in the art that although the foregoing description has been made on embodiments of the invention, the invention is not limited thereto and various changes and modification may be made without departing from the spirit of the invention and the scope of the appended claims.

The invention claimed is:

1. An amplifier apparatus comprising:
   a carrier amplifier circuit having an amplifying element operable in class-AB or class-B;
   a plurality of peak amplifier circuits having amplifying elements operable in class-B or class-C,
   wherein an output of said carrier amplifier circuit and outputs of said plurality of peak amplifier circuits are combined for signal output;
   said plurality of peak amplifier circuits start to operate in stages in response to each input level thereof;
   a saturation output of a peak amplifier circuit of said plurality of peak amplifier circuits which starts to operate at a minimum input level is less than a saturation output of said carrier amplifier circuit; and
   a harmonic wave generation circuit having:
   a divider operative to divide for distribution an input signal of a basic frequency into basic wave signals,
   a harmonic generator operative to generate a secondary harmonic wave from one of the basic wave signals divided,
   an adjuster operative to adjust phase and amplitude of the secondary harmonic wave generated at said harmonic generator, and
   a combiner operative to combine together the phase/amplitude-adjusted secondary harmonic wave and a remaining one of said basic wave signals divided and then output a combined signal,
   wherein a secondary harmonic wave as output from said harmonic wave generation circuit is injected into an input signal of the carrier amplifier circuit and/or peak amplifier circuit.

2. The amplifier apparatus according to claim 1, wherein each of the carrier amplifier circuit and the peak amplifier circuit further comprises:
   a harmonic frequency wave reflection circuit for reflecting a harmonic frequency wave of the input signal.

3. The amplifier apparatus according to claim 2, wherein the harmonic frequency wave reflection circuit is configured to be a high-input impedance for the basic frequency and be a low-input impedance for a secondary harmonic frequency of the basic frequency.

* * * * *